United States Patent
Flaitz et al.

(10) Patent No.: US 6,410,399 B1
(45) Date of Patent: Jun. 25, 2002

(54) PROCESS TO LOWER STRAP, WORDLINE AND BITLINE CONTACT RESISTANCE IN TRENCH-BASED DRAMS BY SILICIDIZATION

(75) Inventors: Philip Lee Flaitz, Newburgh; Herbert L. Ho, Cornwall; Subramanian Iyer, Mount Kisco; Babar Khan, Ossining; Paul C. Parries, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/606,493

(22) Filed: Jun. 29, 2000

(51) Int. Cl.⁷ ........................ H01L 21/20; H01L 21/8242
(52) U.S. Cl. ........................ 438/387; 438/241; 438/243
(58) Field of Search ............................ 438/387, 246, 438/243, 241, 592

(56) References Cited

U.S. PATENT DOCUMENTS

| | | | | |
|---|---|---|---|---|
| 4,921,816 A | * | 5/1990 | Ino | 437/52 |
| 5,111,259 A | * | 5/1992 | Teng et al. | 357/23.6 |
| 5,250,829 A | * | 10/1993 | Bronner et al. | 257/301 |
| 5,364,812 A | * | 11/1994 | Yashiro et al. | 437/52 |
| 5,681,769 A | * | 10/1997 | Lien | 437/41 |
| 5,876,796 A | * | 3/1999 | Regolini et al. | 427/255 |
| 5,981,332 A | * | 11/1999 | Mandelman et al. | 438/246 |
| 6,004,844 A | * | 12/1999 | Alsmeier et al. | 438/246 |
| 6,157,068 A | * | 12/2000 | Hashimoto et al. | 257/384 |
| 6,200,873 B1 | * | 3/2001 | Schrems et al. | 438/386 |
| 6,225,171 B1 | * | 5/2001 | Yu et al. | 438/296 |

OTHER PUBLICATIONS

Wolf et al., "Silicon Processing for the VLSI Era—vol. 1", Lattice Press, 1986, pp. 397–398 and 520.*

* cited by examiner

Primary Examiner—Michael Trinh
(74) Attorney, Agent, or Firm—Scully, Scott, Murphy & Presser; Eric W. Petraske

(57) ABSTRACT

A semiconductor device manufacturing method for silicidizing silicon-containing areas in array regions of dynamic random access memory (DRAMS) and embedded DRAM (eDRAM) devices to lower electrical resistance, and improve device reliability at low temperatures.

17 Claims, 3 Drawing Sheets

PROCESS TO LOWER STRAP, WORDLINE AND BITLINE CONTACT RESISTANCE IN TRENCH-BASED DRAMS BY SILICIDIZATION

FIELD OF THE INVENTION

The present invention relates to semiconductor device manufacturing, in particular, to a method of silicidizing silicon-containing areas in the array region of a dynamic random access memory (DRAM) or embedded DRAM (eDRAM) device to lower electrical resistance and to improve device reliability at low temperatures.

BACKGROUND

In semiconductor integrated circuits, the reliable operation of the devices therein depends heavily upon the passage of electrical currents through interconnected pathways in the devices. In these circuits, since current flow is directly related to resistance, the lower the resistance, the better the operation.

Further, in these devices, an important performance requirement is reliable operation at low temperatures. Thus, for instance, DRAM modules intended to operate at 0° C. must pass a −10° C. test in order to reduce the likelihood of device failure. Similarly, for eDRAM modules wherein a part of the module is embedded in the semiconductor structure, an even more severe test at −40° C. has been suggested.

One problem that complicates the fabrication of semiconductor devices having low resistance and high reliability at low temperatures, is the observation that as the temperature is lowered, the resistance of the silicon increases. Thus, in DRAM and eDRAM devices that rely on doped silicon structures to provide the passage of electrical charge, the resistance increases and array functionality decreases as the operating temperature is lowered.

Insofar as eDRAMs are concerned, the buried strap is a conductive pathway in an eDRAM device located between the active silicon on the drain side of the field effect transistor (FET) and the trench capacitor. The buried strap facilitates charges to be written to, or read from, the capacitor and comprises a highly doped portion of the substrate. Physically, the buried strap is approximately 100 nm thick, extends across the pathway, and is buried approximately 50 nm below the surface of the substrate.

In the art, it is known to use various approaches to reduce resistance and improve reliability at lower temperatures. For example, designers have implemented shorter pathways in conjunction with utilizing highly conductive metals, and/or highly doped areas of the substrate, and/or highly conducting silicides, notably, the silicides of cobalt, nickel and titanium.

In this regard, silicides are conventionally formed in self-aligned processes, whereby a metal film is deposited over the silicon-containing region to be silicidized. The process involves in-situ cleaning of the silicon-containing region, followed by deposition of a metal on the silicon-containing region by means well known in the art. Thereafter, the structure is annealed by heating to form the silicide. Any unreacted metal that is not silicided may be removed by a selective wet etching process to remove metal without attacking the silicide. In DRAM and eDRAM devices, silicides may be found in the drain region, bitline contact, wordline and interconnecting pathways.

In the art, silicidizing silicon-containing regions has achieved success in reducing resistance and improving functionality at low operating temperatures, however, notwithstanding the success, it has become evident that DRAM yields are affected by: a) excessive node junction leakage due to the presence of the silicide; and b) silicide agglomeration on the wordline and in the active area. As a result, current DRAM and eDRAM manufacturing processes have steered completely away from silicidizing the pathways and structures. Consequently, the only silicide seen is these structures is a polycided wordline i.e., gate conductor, comprising tungsten silicide on a highly doped polysilicon.

Since silicides offer the potential for low resistance and reliable operation at low temperature, it is desirable to continue to utilize silicides in memory structures, but without the prior art problems.

Accordingly, it is desirable to provide a method of forming silicides in silicon-containing regions in the array device regions of a memory device whereby the problems of excessive node junction leakage and silicide agglomeration are minimized or eliminated, while providing for better conduction and improved reliability.

It is also desirable to provide a method of siliciding silicon-containing areas in the array device regions of DRAMs and eDRAMs to lower resistance and improve low temperature reliability.

SUMMARY OF THE INVENTION

In view of the foregoing, it is an object of the present invention to provide a method of silicidizing silicon-containing areas in the array regions of memory devices to lower the electrical resistance thereof.

It is also an object of the invention to provide a method of fabricating DRAM and eDRAM devices wherein the resistance of the buried strap, the wordline, the bitline contact and the drain region and abutting areas is lowered.

These and other objects are achieved in the present invention by utilizing a method of silicidizing silicon-containing areas in the array region of a memory devices to lower electrical resistance thereof. Specifically, the method of the present invention comprises the steps of:

a) applying a resist and a block-level mask to lithographically define an array region of a memory device;

b) doping said array region of said memory device so as to form a graded junction therein;

c) removing said resist;

d) annealing said array region;

e) etching said array region of said memory device so as to remove any native oxides from surfaces of said array region;

f) depositing a layer of conductive metal on said array region;

g) forming a capping layer on said conductive metal layer;

h) rapidly annealing said array region at a temperature less than about 600° C.;

i) removing said capping layer and any residual conductive metal from said array region;

j) rapidly annealing said array region at a temperature of about 700° C. or above; and k) depositing an oxide layer on said array region.

Also provided in accordance with an object of the present invention is a method wherein an electrical pathway connecting the bitline contact of an eDRAM device with a capacitor device of the said eDRAM memory cell is silicidized for lowered resistance and improved low temperature operation.

Step b) of the present invention which forms a deep and graded junction underneath the silicide is carried out utilizing a "medium-high" dose of phosphorous (dose greater than 2E13) and a "medium" implant energy (25–60 KeV). The formation of the deep, graded junction in the array device region prior to silicidation reduces leakage next to the node junction as well as resistance in the pathways.

DETAILED DESCRIPTION OF THE INVENTION

Figure 1A:
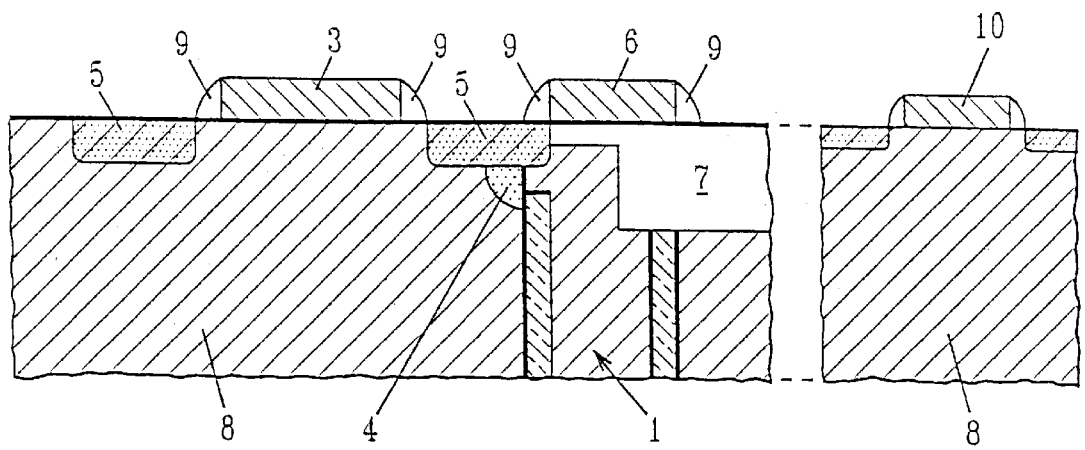
FIG. 1(a)–(f) are schematic diagrams to illustrate the method of the present invention.

Before the method of the present invention is described in detail in view of the FIGS. 1(a)–(f), it should be noted that in fabricating silicidized silicon-containing areas in array regions of semiconductor memory device, it is critical to provide for a step wherein a deep and graded junction is formed in the substrate so as to minimize the possibility of junction leakage; and for a step wherein, after forming the silicide, annealing of the silicide is controlled so as to reduce agglomeration.

Regarding providing for a deep and graded junction, this is carried out by implanting into the substrate a dopant such as phosphorus at an appropriate implantation energy and dosage, as discussed below, and in accordance with the present method.

Regarding, a step to reduce silicide agglomeration, this is usually carried out by setting the temperature of the metal film deposition and anneals, subsequent to silicidization, at 600° C. or less. By specifying the annealing temperature range, redistribution of the dopant is minimized. In general, annealing to control agglomeration is well known and therefore the problem of agglomeration and the potential problem of device threshold voltage variation that results is, by comparison to the problem of junction leakage, not as significant.

Thus, regarding silicidizing of the substrate, the bigger problem is how to minimizing junction leakage with a silicide present next to the node junction.

In accordance with the present invention, three alternatives are provided to address the problem of siliciding the structure and lowering node junction leakage. In all three alternatives, ideally, the structure to be silicidized should be as close as possible to the surface for best results. How close to the surface the structure should be is determined by design considerations which, for the present purposes, is well known in the art, and therefore not elaborated upon here.

In summary, and with regard to the fabrication of eDRAM devices for minimized junction leakage in accordance with the present invention, a first alternative is to implant the structure with phosphorus after the transistor region has been defined by utilizing a thin spacer nitride, 5–20 nm thick, in a manner well known in the art. This implant process also creates a lightly doped drain (Ldd) region next to the gate transistor edge which helps control the off-current of the array device. In this alternative, the implant is carried out in conjunction with a block-level mask in which the regions to be silicidized are exposed, while the rest of the regions is covered with a resist. It should be noted that the implant energy and dose to be used is dependent on the width of the spacer nitride utilized. Accordingly, for this alternative, the implant is carried out using a thin spacer nitride and applying an implantation energy of from about 20 to about 30 KeV, at a phosphorus dosage of from about 2E13 to about 1E14.

In the second and preferred alternative, the implant is carried out at a higher energy also using phosphorus, but with a thicker spacer nitride, ranging from 20–60 nm thick, and implanting immediately after the nitride film has been deposited and not etched.

In this alternative, an implantation energy of from about 40 to about 55 KeV at a dose of about 3E14 to about 1E15, preferably a dose of from about 5E14 to about 7E14, is used.

In the third alternative, a dual implant process is utilized wherein an implant dose, as described in the first alternative is applied followed by the application of a higher implant dose, as with the second alternative.

Reference is now made to FIG. 1(a)–(f) wherein the method of the invention is illustrated schematically by cross-sectional diagrams, to describe the present method in more detail.

FIG. 1(a) is a simplified schematic of a cross section of the starting structure of a conventional eDRAM, employed herein to illustrate the method, comprising a capacitor 1 embedded in a substrate 8 which will be in subsequent electrical connection with a bitline contact via a pathway comprising buried strap 4, junctions 5, active areas abutting wordline 3. Also shown in FIG. 1(a), but for clarification purposes only, is shallow trench isolation structure 7, and passing wordline 6 and logic portion 10, passing wordline 6 and nitride spacers 9. In accordance with the present invention, it is assumed that the structure shown in FIG. 1(a) is available for siliciding and that similar structures, depicting semiconductor devices including DRAMs, suitably configured by ordinary skill, can be used with the present method.

Figure 1B:
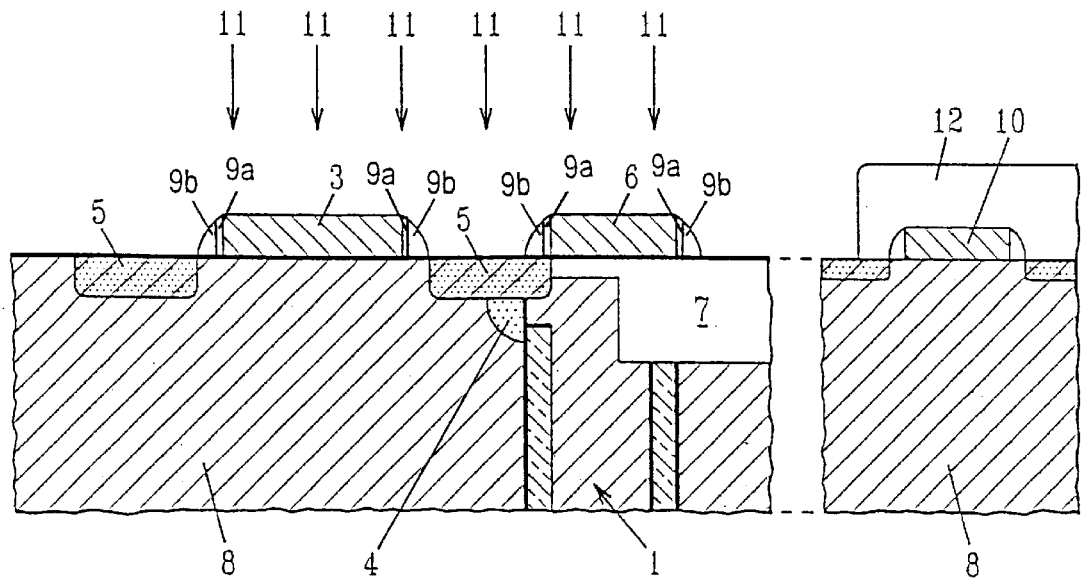

Next, and in view of FIG. 1(b), a resist 12 is applied on substrate 8 and a lithographic process is performed such that the array is cleared of resist while the remainder of the chip (primarily composed of logic devices) is covered with resist 12. Thus, the pathways that allow charge to be written and read from the cell, buried strap 4 and junctions 5, are exposed to silicidization. The resist layer 12 is applied by deposition processes well known in the art utilizing a resist material, also well known in the art.

Next, and also in view of FIG. 1(b), the structure comprising the pathway from step a) to be silicized is doped utilizing, by a first alternative step, phosphorus and low energy implantation by a first method schematically shown by arrows 11. In the first embodiment, an Ldd phosphorus implant is performed immediately after a thin spacer nitride (5–20 nm thick) 9a has been deposited and etched to the silicon substrate. Suitable implantation energy is from about 20 to about 30 KeV at a dose of from about 2E13 to about 1E14 phosphorus utilizing the thin spacer nitride.

In this step, it should be noted that a second alternative implant procedure can be applied using a higher dose and higher implantation energy, using a spacer nitride 9b having a thickness of from about 20 nm to about 60 nm thick. However, in this second embodiment, the implantation is performed immediately after the nitride is deposited. Because the nitride spacer has not been etched down to the silicon, the implant needs to be done at higher energies, e.g., 40–60 KeV, to guarantee that the dopant goes through the nitride film. In this process, a higher doping level, e.g., 2E14–1E15 phosphorus, may be necessary to provide sufficient overlap of the array device.

Also it should be noted, in this step, a third alternative comprising a dual array extension process can be applied. In this embodiment, first spacer nitride, e.g., 5–20 nm thick 9a has been formed and a phosphorus implant having doses as specified in the first embodiment is performed after the spacer nitride definition. After the first spacer process, second and thicker nitride layer 9b is deposited (e.g., 20–60 nm thick as mentioned in the second embodiment) and etched to the silicon substrate. A second block-level masking step is performed such that the arrays are cleared of resist while the logic areas remain covered. This is then followed by a phosphorus implant using energies of from about 25 to about 40 KeV and with doses of from about 2E14 to about 1E15. The energy range may be slightly lower than that stated in the second embodiment to minimize punch through of junctions in the vertical direction. It is noted that in FIG. 1b, spacers 9a and 9b are both shown, but it is possible to use a structure which contains only spacer 9a and 9b. For clarity, spacers 9a and 9b will be labeled as 9 in the remaining drawings.

Figure 1C:
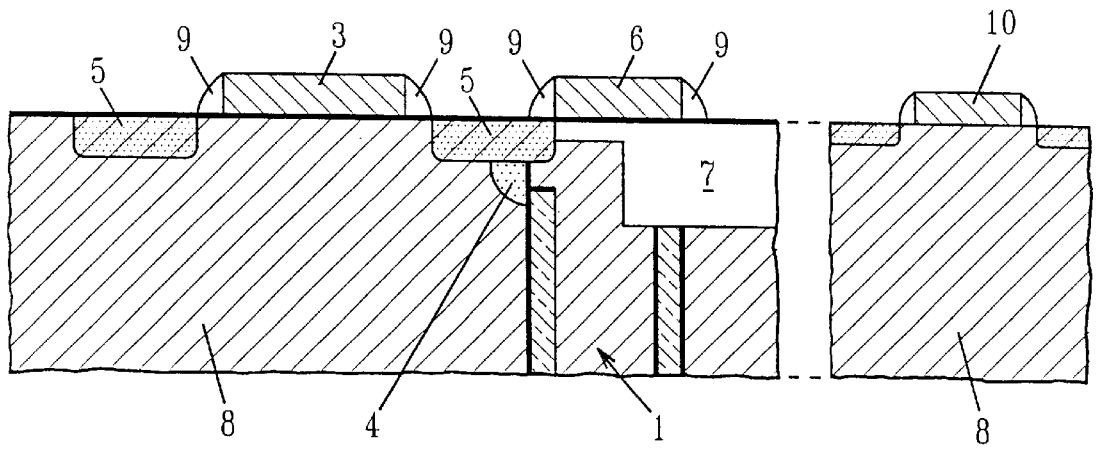

Next, and in view of FIG. 1(c), doping resist layer (not shown) is stripped using conventional procedures, and the resulting structure comprising the array to be silicized comprising buried strap 4, junctions 5, active areas 9 disposed under and abutting wordline 3 is annealed, and the pathway is etched to remove any native oxides from the pathway. Etching is carried out by utilizing hydrofluoric acid (HF) and standard procedures well known in the art. Preferably, a 200:1 DHF is used for about 5 to about 10 minutes. Other chemical etchants that are capable of removing native oxides can also be employed in this step of the present invention.

Figure 1D:
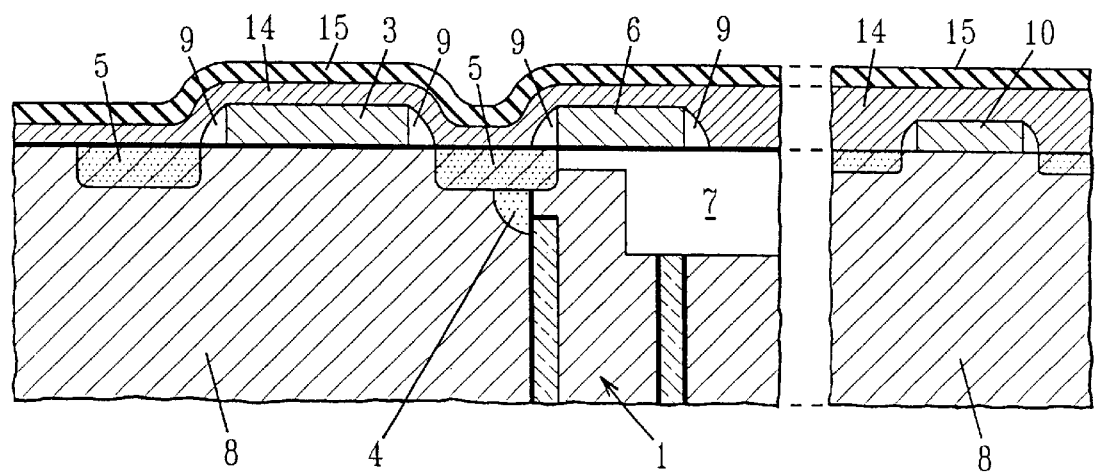

Next, and in view of FIG. 1(d), a layer of conductive metal 14 to be silicized is deposited on the substrate 8 over the array to be silicized comprising buried strap 4, junctions 5, active areas of disposed and abutting and wordline 3 is annealed, by well known deposition in the art. Suitable conductive metals include, but are not limited to: cobalt, nickel, titanium and alloys thereof, with cobalt being preferred. The metal layer 14 is then capped by a capping layer, e.g., a nitride, 15 also by deposition techniques well known in the art. A preferred thickness of cobalt is from about 7 to about 10 nm, and a preferred capping layer is titanium nitride having a preferred thickness of from about 15 to about 20 nm. The deposited layers, including substrate 8 is then rapidly annealed at a temperature of from about 500° to about 600° C., preferably about 550° C., for about 30 seconds or less by deposition techniques well known in the art, to form a silicided layer.

Figure 1E:
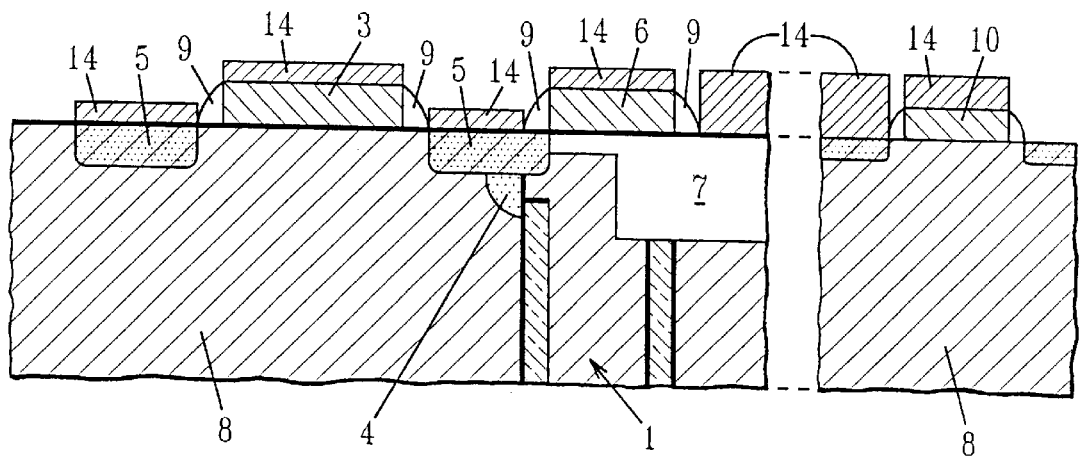

Next, and in view of FIG. 1(e), the capping layer (not shown) and residual metal (not shown) are removed utilizing an etchant. The capping layer, which is typically composed of TiN, can be removed by a 5:1:1 solution of $H_2O:NH_4OH:H_2O_2$ while the unreacted Co metal can be removed by a 6% $HNO_3$ acid solution. Thereafter, the structure including substrate 8 is further rapidly annealed at a higher temperature, in the range of from about 700° to about 800° C., preferably about 750° C., for about 30 seconds or less by annealing techniques well known in the art.

Figure 1F:
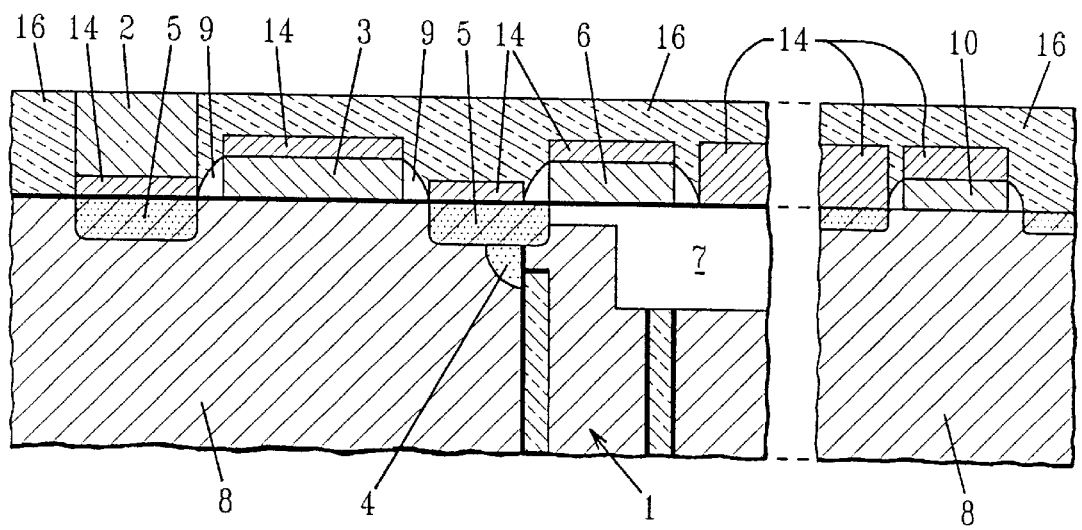

Finally, and in view of FIG. 1(f), a thick layer of oxide, 0.5–1 um thick, 16 is deposited on the silicidized layer 14 and planarized by chemical-mechanical polishing (CMP) to properly isolate surface structures. The bitline contacts 2 are formed by: (1) performing a lithographic process that defines contact holes in the mask, (2) etching the contact holes in the oxide down to the silicidized active area, and (3) depositing the tungsten or other conductive metal film to fill the oxide holes. Thus, a silicidized pathway comprising buried strap 4 and junctions 5 between capacitor and bitline contact 2 is formed.

It is to be noted that although the invention is described with reference to an eDRAM device structure, the method is also applicable to other device structures including DRAM devices.

Accordingly while the present invention has been described and enabled so that one skilled in the art can apply the invention including the best mode, it will be understood by those skilled in the art that the foregoing and other changes in forms and details can be made without departing from the scope of the claimed invention.

What is claimed is:

1. A method of silicidizing an array region in a memory device to lower electrical resistance of said array region, comprising the steps of:

a) applying a resist and a block-level mask to lithographically define an array region of a memory device, said array region includes, at least one wordline having junction regions abutting said at least one wordline, said junction regions are formed in a surface of a substrate;

b) doping said array region of said memory device using a dual implant process so as to form a graded junction in said substrate;

c) removing said resist;

d) annealing said array region;

e) etching said array region of said memory device so as to remove any native oxides from surfaces of said array region;

f) depositing a layer of conductive metal on said array region;

g) forming a capping layer on said conductive metal layer;

h) rapidly annealing said array region at a temperature less than about 600° C. so as to form a metal silicide over at least said one wordline and said graded junction;

i) removing said capping layer and any residual conductive metal from said array region;

j) rapidly annealing said array region at a temperature of about 700° C. or above; and k) depositing an oxide layer on said array region.

2. The method claim 1, wherein step b) comprises utilizing phosphorus as a dopant.

3. The method of claim 2, wherein step b) comprises at least an implant step that utilizes ion-implantation energies of from about 20 to about 30 KeV and a phosphorus dosage of from about 2E13 to about 1E14.

4. The method of claim 2, wherein step b) comprises at least an implant step that utilizes ion-implantation energies of from about 40 to about 55 KeV and a phosphorus dosage of from about 3E13 to about 1E15.

5. The method of claim 1, wherein said dual implant process is carried out by first ion implanting at energies of from about 20 to about 30 KeV and a phosphorus dosage of from about 2E13 to 1E14 and thereafter implanting at an energy of from about 40 to about 50 KeV and a phosphorus dosage of about 3E14 to about 1E15.

6. The method of claim 1, wherein a nitride spacer having a thickness of from about 5 to about 20 nm is employed in said dual implant process.

7. The method of claim 1, wherein a nitride spacer having a thickness of from about 20 to about 60 nm is employed in said dual implant process.

8. The method of claim 5, wherein a nitride spacer having a thickness of from about 5 to about 20 nm is employed in said first ion implant and a nitride spacer having a thickness of from 20 to 60 nm is employed in said second ion implanting step, said nitride spacers being formed prior to doping.

9. The method of claim 1, wherein step e) comprises utilizing a 200:1 hydrofluoric acid etch for about 5 to about 10 minutes.

10. The method of claim 1, wherein said conductive metal comprises a metal selected from the group consisting of cobalt, nickel, titanium and alloys thereof.

11. The method of claim 10, wherein cobalt having a thickness of about 15 to about 20 nm is employed.

12. The method of claim 1, wherein step g) comprises utilizing titanium nitride.

13. The method of claim 1, wherein step h) comprises annealing said array region at a temperature in the range of about 500° C. to about 600° C. for about 30 seconds or less.

14. The method of claim 13, wherein said anneal temperature is about 550° C.

15. The method of claim 1, wherein step j) comprises annealing said array region at a temperature in the range of about 700° C. to about 800° C. for about 30 seconds or less.

16. The method of claim 15, wherein said annealing temperature is about 750° C.

17. The method of claim 1, wherein said array region connects a bitline contact of an eDRAM device with a capacitor device of said eDRAM memory cell.

* * * * *